United States Patent [19]

Rhodes

[11] 4,059,796
[45] Nov. 22, 1977

[54] SECOND HARMONIC MAGNETIC FIELD DETECTION CIRCUIT WITH MEANS TO RECTIFY THE SENSED SIGNAL

[75] Inventor: Melvin H. Rhodes, Cedar Rapids, Iowa

[73] Assignee: Rockwell International Corporation, El Segundo, Calif.

[21] Appl. No.: 740,911

[22] Filed: Nov. 11, 1976

[51] Int. Cl.² .............................................. G01R 33/04
[52] U.S. Cl. .................................................. 324/253
[58] Field of Search ........................... 324/43 R, 47, 41

[56] References Cited

U.S. PATENT DOCUMENTS 3,218,547  11/1965  Ling ..................................... 324/43 R
3,944,912  3/1976  Angel et al. ............................ 324/41

FOREIGN PATENT DOCUMENTS 611,194  12/1960  Canada ............................... 324/43 R

OTHER PUBLICATIONS

Ling; S. C., Fluxgate Magnetometer for Space Applications; Jour. Spacecraft; vol. 1, No. 2; Mar.-Apr. 1964; pp. 175-180.

Primary Examiner—Robert J. Corcoran
Attorney, Agent, or Firm—Richard A. Bachand; H. Fredrick Hamann

[57] ABSTRACT

A magnetic field sensing circuit using three windings on a magnetic sensor with one winding using a locally generated excitation voltage, a second winding providing an output induced by the excitation voltage and a third winding both providing external magnetic field sense signals and serving as a feedback winding. The induced excitation voltage is used to generate a signal indicative of the flux in the core for the ultimate purpose of logically switching the sense winding so as to rectify it and supply it back to the third winding as a feedback signal for counteracting the flux in the sensor due to the external field being sensed.

7 Claims, 2 Drawing Figures

SECOND HARMONIC MAGNETIC FIELD DETECTION CIRCUIT WITH MEANS TO RECTIFY THE SENSED SIGNAL

THE INVENTION

The present invention is generally related to electronics and magnetics and more specifically to a circuit using three windings on a magnetic sensor to provide an indication of the magnitude and direction of a magnetic field being detected.

There are many and sundry types of circuits for detecting magnetic fields. However, many of the prior art circuits are either unduly complex or suffered accuracy errors due to temperature variations or other externally varying conditions. Thus, the present circuit was designed to overcome the prior art limitations.

The present detection circuit operates with almost any magnetic sensing unit which generates second harmonic signals. However, it seems to provide a near optimum circuit for the tube sensor presented in copending U.S. Pat. application Ser. No. 740,915 filed Nov. 11, 1976. The present circuit does a very good job of filtering out fundamental signals which occur in most types of sensors but operates even more satisfactorily with the referenced tube sensor which does not have any fundamental signals.

It is therefore an object of the present invention to provide an improved magnetic field detection circuit.

Other objects and advantages of the present invention may be ascertained from a reading of the specification and appended claims in conjunction with the drawings wherein:

FIG. 1 is a detailed schematic diagram of one embodiment of the inventive concept, and FIG. 2 is a series of waveforms used in explaining the operation of FIG. 1.

DETAILED DESCRIPTION

Figure 1:
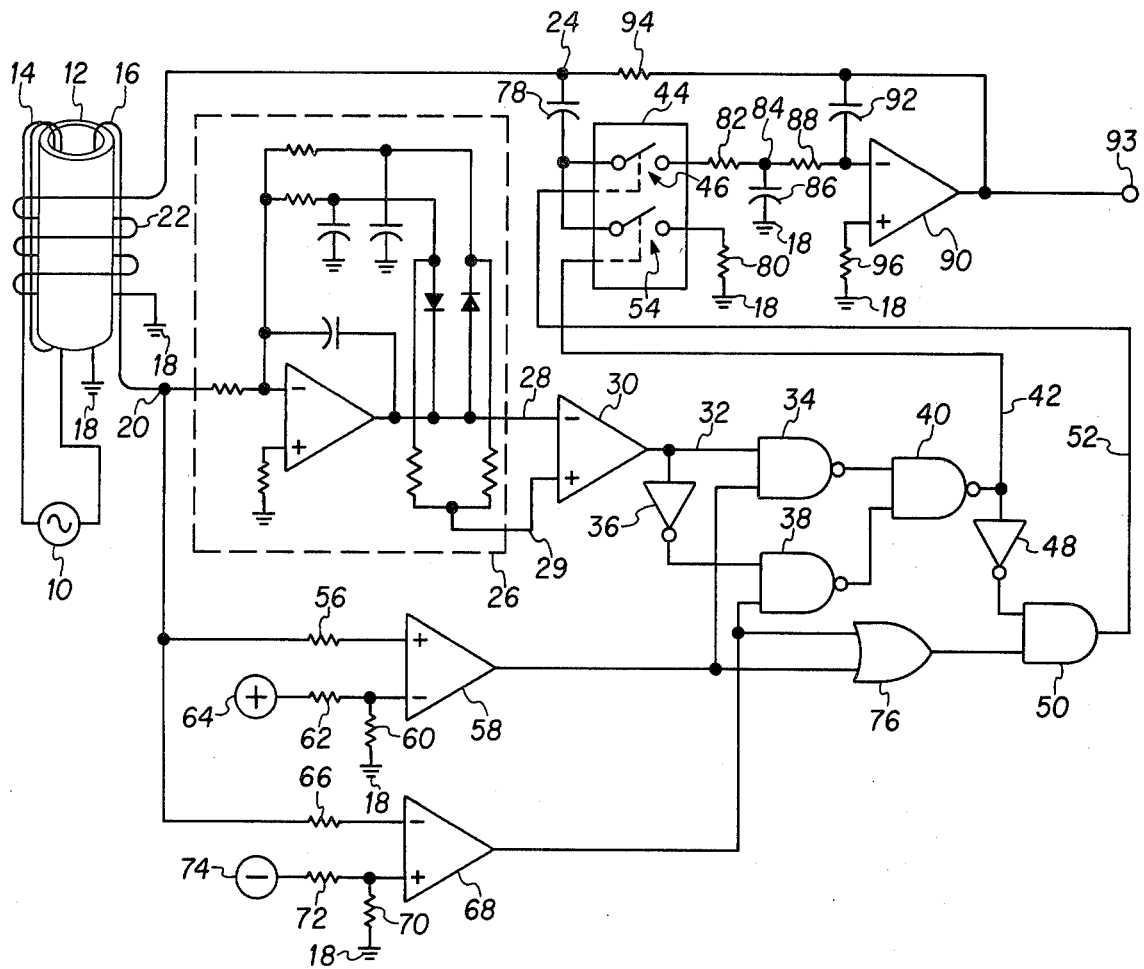

In FIG. 1, an excitation generator or signal source 10 is illustrated supplying signals to a magnetic tube 12 via a winding 14 which is wound from outside to inside of the tube as illustrated. Although in FIG. 2 the excitation signals are square wave, the inventive concept is not limited to the use of square waves. A second winding 16 also is wound from outside to inside of the tube and provides an excitation induced voltage for use in the detection or rectification function of the inventive concept. The winding 16 is connected between ground 18 and an output junction point 20. A third winding 22 is a sense and feedback winding and is also connected to ground 18 as well as being connected at the other end to a junction point 24. More information on a tube type magnetic sensor may be obtained from my copending application Ser. No. 740,915, above referenced, and assigned to the same assignee as the present invention. Junction point 20 is connected to the input of a dashed line circuit 26 containing an A.C. integrator such as is illustrated in copending U.S. Pat. Ser. No. 740,914 filed Nov. 11, 1976 and which is assigned to the same assignee as the present invention. Outputs of this A. C. integrator are supplied on leads 28 and 29 to an operational amplifier 30 used as a comparator. Operational amplifier 30 has its negative or inverting input connected to lead 28 and its positive or non-inverting input connected to 29. An output is supplied on lead 32 to a NAND gate 34 as well as through an inverter 36 to a NAND gate 38. The outputs of NAND gates 34 and 38 are supplied to a NAND gate 40 whose output is supplied as a control input on lead 42 to a set of analog switches 44 to control a switch 54 contained within block 44. The output of NAND gate 40 is also inverted by an inverter 48 and supplied to an AND gate 50. An output of AND gate 50 is used to supply signals on a control lead 52 to control a further switch 46 within block 44.

Junction point 20 is also connected through a resistive element 56 to a positive or non-inverting input of an operational amplifier or comparator 58 having its inverting input connected through a resistor 60 to ground 18 and also through a resistor 62 to a positive power supply 64. Junction point 20 is also connected through a resistive element 66 to an inverting input of an operational amplifier or comparator 68 which has its positive or non-inverting input connected through a resistor 70 to ground 18 and also connected through a resistor 72 to a negative power supply terminal 74. An output of amplifier 58 is connected to one input of an OR gate 76 and also connected to a second input of NAND gate 34. An output of amplifier 68 is connected to a second input of NAND gate 38 as well as to a second input of OR gate 76. An output of OR gate 76 is connected to a second input of AND gate 50.

Junction point 24 is connected through a capacitor 78 to the input side of each of switches 46 and 54. The output of switch 54 is connected through a resistor 80 to ground 18 while the output of switch 46 is connected through a resistor 82 to a junction point 84. A capacitor 86 is connected between junction 84 and ground 18 and is also connected through a resistor 88 to a negative or inverting input of an operational amplifier 90. Operational amplifier 90 is connected to have a capacitor 92 between its output 93 and its input so as to operate as an integrating amplifier. A resistor 94 is connected between the output and junction point 24 to provide feedback relative to the sense signal. A resistor 96 is connected between the positive or non-inverting input of amplifier 90 and ground 18.

Figure 2:
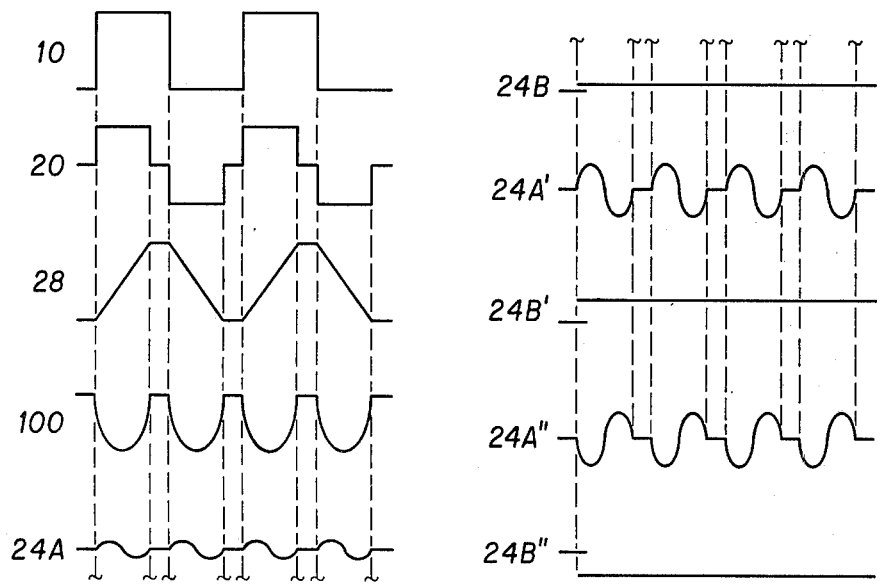

In FIG. 2, waveform 10 is representative of the signals supplied by generator 10 to the sensing tube. Waveform 20 is the output obtained from the excitation winding at junction point 20. Due to the design of the tube sensor, the excitation induced voltage appearing on line 20 will remain same regardless of the direction and magnitude of the external field being sensed. In other sensors, such as rod sensors, or various other types of magnetic cores, the excitation voltage would not remain constant in form. However, the inventive concept will still operate as long as the design is such that the core 12 saturates on each half-cycle of the excitation voltage regardless of the strength of the of the external field being measured.

The waveform 28 is representative of the output from the A. C. integrator 26 while the waveform 100 is representative of the reluctance of core 12 to the external field. As illustrated, the reluctance is the lowest when the core is half-way between saturation extremes proceeding toward saturation in an opposite extreme. The reluctance is of course highest when the core is saturated in either direction. Waveforms 24A, 24A' and 24A" are representative of different conditions of the magnetic field being sensed, and represent an induced signal being obtained from the sense winding and supplied through capacitor 78, switch 44 and to amplifier 90. The waveforms 24B, 24B' and 24B" are representaof the signals 24A, 24A' and 24A", respectively. The resultant signal 24B is fed back through resistor 94 to the winding 22 which operates as a combination sense and feedback winding to counteract the effect of lines of force being generated within the core by the external magnetic field being sensed. Thus, the feedback operates to cause very little disturbance of the shape of waveform 20 even when other types of magnetic sensing elements are used. As previously indicated with the tube type sensing element illustrated in this application, there is no disturbance of this signal anyway.

OPERATION

In operation, an excitation induced voltage is obtained from winding 16 and supplied to the A. C. integrator 26 which produces the triangular waveform 28. Waveform 28 is representative of the excitation produced flux in the core 12. As will be ascertained, the flux in the core varies from a maximum at saturation in one direction to a maximum at saturation in the other direction. The change in flux will be relatively linear if a core material such as permalloy is used with a square wave voltage excitation. As known, permalloy has a relatively flat saturation characteristic as compared to transformer type magnetic material. More information on a tube type magnetic sensor may be obtained from my copending application Ser. No. 740,915, above referenced.

The comparators 30, 58 and 68 are used in a switching manner to operate switches 46 and 54 so as to effectively fullwave rectify the signal 24A being supplied by the sense winding 22. The comparator 30 senses whether the waveform 28 is positive or negative with respect to ground and switches NAND gates 34 and 38 accordingly. The output of amplifier 30 is a logic 1 if the input is negative with respect to ground and is logic 0 if the input is positive with respect to ground. Operational amplifier 58, on the other hand, will provide a logic 1 output only if the input from waveform 20 is greater than a predetermined positive value as defined by the voltage source 64 and the dividing resistors 60 and 62. Operational amplifier 68 will provide a logic 1 output if the input is more than a predetermined amount negative as determined by similar circuitry 70, 72 and 74. Thus, the circuitry illustrated operates to actuate either switch 46 or 54 whenever waveform 20 is greater than a predetermined amount in either the negative or positive direction wherein one of the two switches is operated for a quarter-cycle and the other switch is operated for the next quarter-cycle. In the last half-cycle of the operation, the first switch is again operated for a quarter-cycle and the second switch is again operated for a quarter-cycle.

Referring to the signals 24A, it will be noted that in the first quarter-cycle, a charge is placed on capacitor 78 while switch 54 is connected to ground and then in the next quarter-cycle when switch 54 is open and switch 46 is closed, the charge is transferred to capacitor 86 so as to be applied to the integrator amplifier 90 and fed back as signal 24B to the feedback winding 22. As illustrated in 24A, a weak magnetic field is being sensed from one direction. In waveform 24A', the same direction of magnetic field is being sensed but is substantially increased in amplitude.

As will be noted, the feedback signal 24B' is of a greater amplitude than 24B. Waveform 24A" is indicative of the same amplitude signal as obtained from 24A' but indicates that the magnetic field is of the opposite sense or opposite direction of that providing the input signal 24A'. Accordingly, the output signal 24B" is negative with respect to ground instead of positive as 24B' is.

It should be realized that the circuit of FIG. 1 is a preferred embodiment as used in one implementation of the invention. The filter using components 82, 86 and 88 reduces ripple at the output of the integrator using amplifier 90 and capacitor 92. If the ripple is not objectionable, the aforementioned filter can be removed. Further, the values of resistors 80 and 82 can be reduced to zero if a resistor is inserted between capacitor 78 and the switches 44. While a resistor is shown between the plus input and ground 18 amplifier 90, many of today's amplifiers are sufficiently stable that such a resistor is not needed. The same holds true for the integrating amplifier within block 26.

If noise in the switching signal can be tolerated, further economies can be achieved by eliminating the bias network comprising resistors 60, 62, 70 and 72 along with their associated power sources 64 and 74 and replacing these circuits with a short from the respective terminal to ground 18. At the same time, the OR gate 76 would be eliminated and the AND gate 50 would be replaced with a short between the output of inverter 48 and lead 52.

In summary, the present inventive concept can be used with any magnetic sensing means having three windings but in a preferred embodiment would use a tube sensor such as 12 to eliminate interaction between the excitation winding and the sense winding 22. Signals from the induced excitation winding 16 are applied to an A. C. integrator to obtain a signal indicative of the flux within magnetic sensor 12 and are also applied to a pair of comparators 58 and 68 which operate after the input signal is more than a predetermined amount positive or negative as described previously. The output signals from the three comparators are logically switched to control switches 46 and 54 in a manner to fullwave rectify a sense signal from winding 22. This rectified signal is smoothed by a filter utilizing amplifier 90 and then fed back as a D. C. signal to counteract the effect of the external magnetic fields flux within core 12. This feedback signal as provided on output 93 is thus indicative of the direction and amplitude of the magnetic field.

I have illustrated a preferred embodiment of my inventive concept. As will be apparent to those skilled in the art, other configurations of the inventive concept can be arranged. By using two more sensors, each orthogonal the other two sensors, a sensing unit can be arranged to obtain the exact direction of magnetic field. While a specific logic switching circuit has been illustrated, other logic networks and rectification means may be used. Thus, I wish to be limited only by the scope of the appended claims.

What is claimed is:

1. Magnetic field detection apparatus for use with a magnetic sensor of the type having a magnetic core, an excitation producing winding, an excitation detecting winding, and a magnetic field sensing winding operatively associated with said core, comprising:
    means for supplying a periodic excitation signal to said excitation producing winding to induce a flux in said magnetic core to drive said magnetic core periodically into saturation, to induce a voltage in the excitation detection winding and to enable the magnetic field to be detected to induce a signal onto said sensing winding;

first means connected to said excitation detecting winding for detecting the direction of the flux produced in said magnetic core by the excitation signal and generating signals indicative thereof;

second means connected to said excitation detecting winding for detecting the polarity of the induced voltage and when the induced voltage exceeds a predetermined level and generating signals indicative thereof;

integrating means having an input and an output;

means connected to the sensing winding and to the signals from said first and second means to rectify the signals induced onto said sensing winding in timed relation with changes in the polarity of the induced excitation voltage and the direction of the excitation signal induced flux, and supplying the rectified signals to the input of said integrating means;

and feedback means connected between the output of said integrating means and said sensing winding for supplying feedback signals to said sensing winding to substantially cancel the effect of flux generated in said magnetic core by the magnetic field to be detected.

2. Apparatus as claimed in claim 1 wherein said means for detecting the direction of the excitation produced flux comprises second integrating means connected to said excitation detecting winding for producing an output signal indicative of the flux induced in said magnetic core by said excitation signal, and comparator means for receiving the output signal from said second integration means for generating a first logic state when the flux is in a first direction and a second logic state when the flux is in a second direction.

3. Apparatus as claimed in claim 2 wherein said means for detecting the polarity of said induced voltage comprises positive and negative voltage level comparators connected to said excitation detecting winding to produce respective positive and negative voltage level indicating outputs.

4. Apparatus as claimed in claim 3 wherein said rectifier means comprises logic means connected to receive the output of said flux direction detecting means and the positive and negative voltage level indicating outputs for providing demodulation signals which are phase sensitive to the signals induced onto the sensing winding.

5. Apparatus as claimed in claim 4 wherein said rectifier further comprises means responsive to said demodulation signals to switchingly deliver the signal induced onto the sensing winding in accordance with the polarity changes of the induced signal to said first mentioned integrator means.

6. A magnetic field detector, comprising:

a magnetic sensor having a magnetically saturable core;

means for applying a periodic excitation signal to said core to produce an excitation flux in said core and to drive said core periodically into saturation;

means for generating an induced voltage in response to said excitation flux;

means responsive to said induced voltage for detecting the direction of the excitation produced flux in said core and the polarity of the induced voltage and when the induced voltage exceeds a predetermined level, and generating signals in response thereto;

means for sensing a signal in said core induced therein by a magnetic field to be detected between the periodic saturation of said core;

and means connected to said means for sensing and said means for detecting for rectifying the sensed signal in timed relation with changes of the detected excitation produced flux and polarity of the induced voltage from said detecting means, to produce a phase detected output signal.

7. The magnetic field detector of claim 6 further comprising means for feeding said output signal back to said sensing means to cancel said signal induced in said core by said magnetic field to be detected.

* * * * *